US008922972B2

(12) United States Patent
Korman et al.

(10) Patent No.: US 8,922,972 B2
(45) Date of Patent: Dec. 30, 2014

(54) INTEGRAL MODULE POWER CONDITIONING SYSTEM

(75) Inventors: Charles Steven Korman, Niskayuna, NY (US); Neil Anthony Johnson, Niskayuna, NY (US); Michael Andrew de Rooij, Palm Springs, CA (US)

(73) Assignee: General Electric Company, Niskayuna, NY (US)

( * ) Notice: Subject to any disclaimer, the term of this patent is extended or adjusted under 35 U.S.C. 154(b) by 216 days.

(21) Appl. No.: 13/208,607

(22) Filed: Aug. 12, 2011

(65) Prior Publication Data

US 2013/0039028 A1 Feb. 14, 2013

(51) Int. Cl.
| | |
|---|---|
| *H05K 7/00* | (2006.01) |
| *H05K 5/00* | (2006.01) |
| *H05K 1/14* | (2006.01) |
| *H02B 1/01* | (2006.01) |
| *H01L 25/00* | (2006.01) |
| *H01L 31/00* | (2006.01) |
| *H02N 6/00* | (2006.01) |
| *H01L 31/042* | (2014.01) |
| *H01L 31/02* | (2006.01) |
| *H01L 31/05* | (2014.01) |
| *H01L 31/052* | (2014.01) |
| *H01L 31/0525* | (2014.01) |
| *F24J 2/46* | (2006.01) |

(52) U.S. Cl.
CPC ........ *H01L 31/042* (2013.01); *H01L 31/02013* (2013.01); *H01L 31/0424* (2013.01); *H01L 31/05* (2013.01); *H01L 31/0521* (2013.01); *H01L 31/058* (2013.01); *F24J 2/4647* (2013.01); *Y02E 10/50* (2013.01); *Y02B 10/20* (2013.01); *Y02B 10/12* (2013.01); *Y02B 10/70* (2013.01); *Y02E 10/60* (2013.01); *Y02E 10/40* (2013.01)

USPC .......... 361/244; 361/728; 361/729; 361/730; 361/731; 361/732; 361/733; 361/734; 361/735; 361/736; 361/746; 361/829; 136/243; 136/246; 136/247; 136/248; 136/251; 136/252; 136/259

(58) Field of Classification Search
CPC . H01L 31/042; H01L 31/048; H01L 31/0482; H01L 31/0483; H01L 31/0484; H01L 31/05; H01L 31/0521; Y02E 10/50
USPC ................. 361/814, 829, 728–736, 746, 747; 136/244, 251, 243, 246, 247, 248, 252, 136/259
See application file for complete search history.

(56) References Cited

U.S. PATENT DOCUMENTS 6,750,391 B2 * 6/2004 Bower et al. .................. 136/244
2005/0217716 A1 10/2005 Masuda et al.
(Continued)

FOREIGN PATENT DOCUMENTS

WO 2007136318 A1 11/2007
WO WO 2010144637 A1 * 12/2010

*Primary Examiner* — Anthony Haughton
*Assistant Examiner* — Zhengfu Feng
(74) *Attorney, Agent, or Firm* — Jason K. Klindtworth

(57) ABSTRACT

An integral solar module power conditioning system includes one or more solar module support frames. Each frame includes a plurality of plug-and-play electrical connectors integrated therewith. A microinverter or microinverter connector is also integrated with each frame. Each frame is configured to receive a respective solar electric module and to carry electrical power through a plurality of solar electric modules and corresponding microinverters connected together via a plurality of solar module support frames connected together via the plurality of integrated plug-and-play electrical connectors.

14 Claims, 4 Drawing Sheets

(56) References Cited

U.S. PATENT DOCUMENTS

2006/0118163 A1 6/2006 Plaisted et al.
2008/0283118 A1* 11/2008 Rotzoll et al. ............... 136/251
2009/0078299 A1 3/2009 Cinnamon et al.
2009/0084426 A1* 4/2009 Fornage et al. ............... 136/244
2009/0165838 A1* 7/2009 Beck ............................ 136/244
2010/0154864 A1* 6/2010 Oh et al. ...................... 136/248
2011/0048507 A1* 3/2011 Livsey et al. ................. 136/251

* cited by examiner

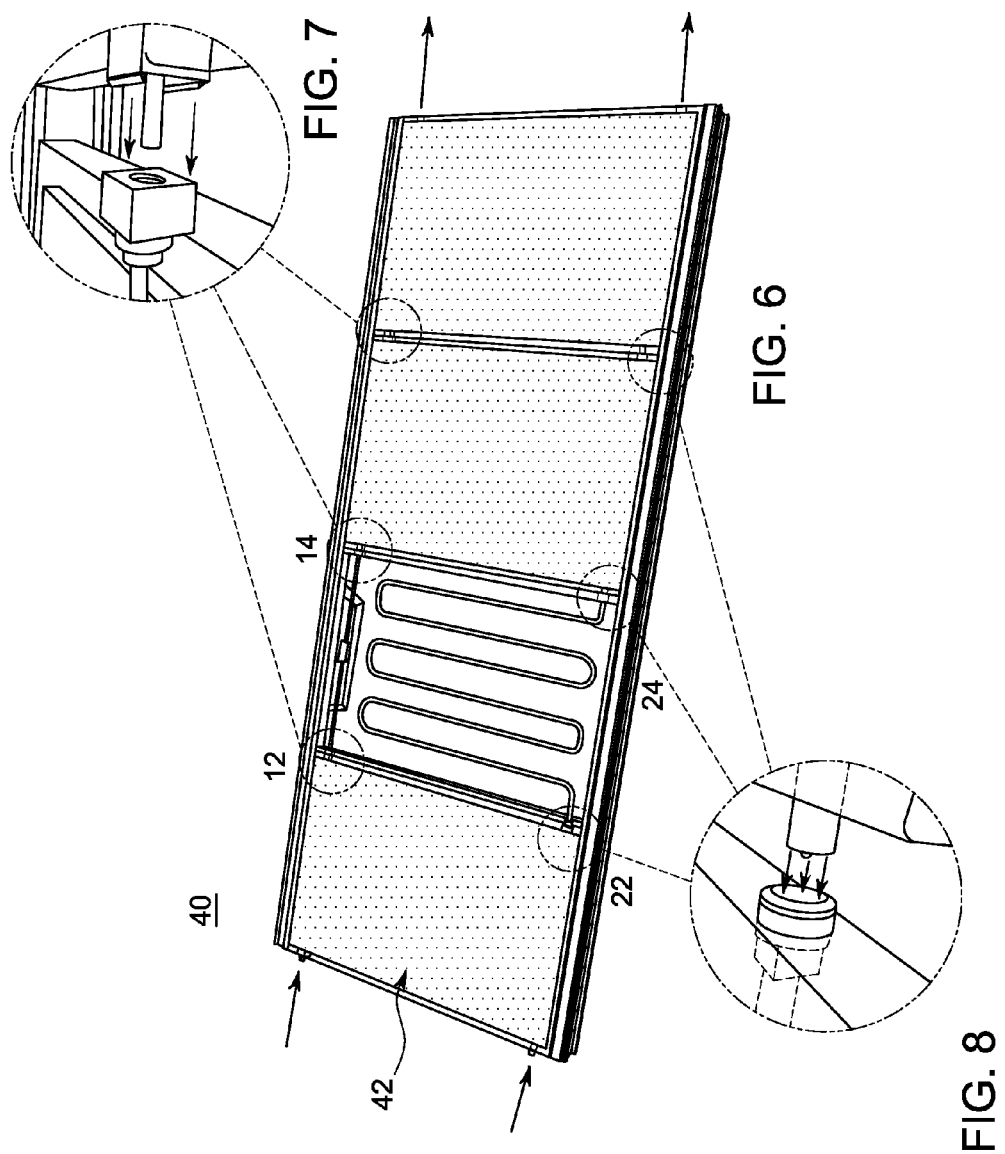

INTEGRAL MODULE POWER CONDITIONING SYSTEM

BACKGROUND

The subject matter of this disclosure relates generally to photovoltaic (PV) systems and more particularly to a system and method of integrating solar modules, inverters and frames into a common rack structure.

Nearly all electrical systems in the U.S. are grounded to mitigate the impacts of lightning, line surges, or unintentional contact with high voltage lines. Most PV systems include modules with metal frames and metal mounting racks that are in exposed locations, e.g. rooftops, where they are subject to lightning strikes, or are located near high voltage transmission lines that in the event of high winds, etc., can come into contact with PV arrays.

The modules in a typical PV array have aluminum frames that are often anodized. The 2008 National Electrical Code (NEC) that has the same requirements as the draft 2010-NEC and governs installation of PV systems requires exposed metal surfaces be grounded. There are special dc wiring and grounding requirements that must be met specifically for dc module strings that can produce voltages at high as 600 volts (V). A failure in the insulating material of the PV laminate could allow the frame to be energized up to 600 V dc.

The installer of a PV system is required to ground each module frame per the NEC and Underwriters Laboratories (UL) standard 1703. This inter-module grounding must be met using a heavy (e.g. at least #10 gauge) copper wire and a 10-32 screw that can cut into the frame. Additional assurances are required even for frames having anodized surfaces. Washer/connectors in such cases are used to cut into the metal frame and provide the best electrical contact. These processes require additional components for installation and require a substantial level of effort to install mounting brackets and grounding wires.

Grounding continuity must also be addressed per the NEC. The oldest NEC requirement necessitates making the ground connection first and breaking the ground connection last. Not all installations follow this practice. The NEC also indicates that the circuit conductors should never be connected without a solid ground in place. Ground fault interruption (GFI) cannot prevent shock in this situation.

Presently, commercial systems that employ micro-inverters still commonly require an equipment ground, meaning that all modules with metallic frames and metal mounting systems have to be connected to a common earth ground through a low resistance path. Such inter-module ground connections are made using processes that require the use of metallic splices, lugs, penetrating washers, and wires. All of these methods require that grounding connections be made at the time of installation and usually require the presence of an experienced electrician. The electrical component of PV module installation is now the largest single cost. Much of the cost associated with installation of PV modules is the expense of an on-site electrician.

AC modules have increasing importance in the solar power generation industry. DC to AC conversion that is local to each solar electric module has certain advantages for residential solar power generation systems. These advantages include without limitation, availability, high energy yield, simple interconnections, and the like. Most implementations of solar AC modules involve the interconnection of a microinverter with a solar electric module. The microinverter is mounted onto the rail and DC-DC cabling is used to implement the connection in some installations. The AC connections are made in parallel through output cables on the microinverters. The microinverter is attached directly to the solar electric module in other installations by bolting the microinverter to the frame of the solar electric module; and the electrical interconnections are made in the same way. The foregoing installation techniques result in no physical change to the solar electric module system that generally requires a junction box to house the DC wiring; and bypass diodes remain in place. Up to ⅓ the cost of a microinverter includes the metal case/heatsink, wiring and connectors.

In view of the foregoing, it would be advantageous to provide a system and method for integrating solar modules, inverters and supporting frames in a manner that reduces installed costs through the integration of certain mechanical and electrical functions normally associated with individual components of the system. The system and method should provide a simple means for a roofing contractor responsible for the mechanical installation to complete the electrical connection between the modules without requiring the presence of an electrician.

BRIEF DESCRIPTION

Briefly, in accordance with one embodiment, an apparatus comprises a first solar module support frame comprising both a microinverter connector and a plurality of plug-and-play electrical connectors integrated therein, wherein the first solar module support frame is configured to receive both a solar electric module and a microinverter and to carry electrical power to the plug-and-play connectors.

According to another embodiment, an apparatus comprises:

a plurality of solar module support frames;

a microinverter integrated with each solar module support frame; and a plurality of plug-and-play electrical connectors integrated with each solar module support frame, wherein the plurality of solar module support frames are connected together in tandem via the plug-and-play electrical connectors to carry electrical power through a plurality of solar electric modules and corresponding microinverters connected together via the plurality of solar module support frame plug-and-play electrical connectors.

According to yet another embodiment, an apparatus comprises:

a solar module rack; and a plurality of solar module support frames mounted in the solar module rack, each solar module support frame comprising both a microinverter connector and a plurality of plug-and-play electrical connectors integrated therein, wherein the plurality of solar module support frames are connected together in tandem via a corresponding plurality of plug-and-play electrical connectors to carry electrical power through a plurality of solar electric modules and corresponding microinverters mounted in the plurality of solar module support frames.

DRAWINGS

These and other features, aspects, and advantages of the present invention will become better understood when the following detailed description is read with reference to the accompanying drawings in which like characters represent like parts throughout the drawings, wherein:

FIG. 6 illustrates a plurality of solar modules installed in a string of solar module support frames interconnected via corresponding plug-and-play electrical connectors and corresponding molded-in plumbing connectors to accommodate electrical power and thermal transfer between the plurality of solar modules according to one embodiment;

FIG. 7 illustrates the plug-and-play electrical connectors depicted in FIG. 6 in more detail; and FIG. 8 illustrates the molded-in plumbing connectors depicted in FIG. 6 in more detail.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

Figure 2:
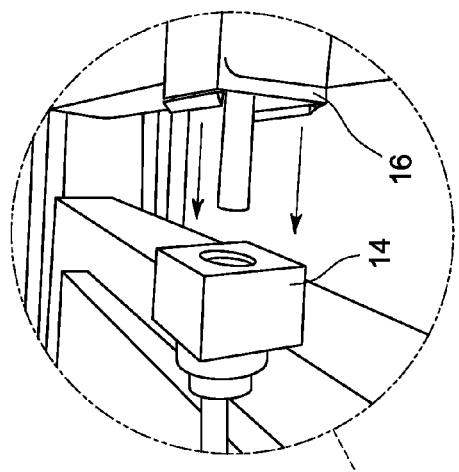
FIG. 2 illustrates the plug-and-play electrical connectors depicted in FIG. 1 in more detail.
Figure 1:
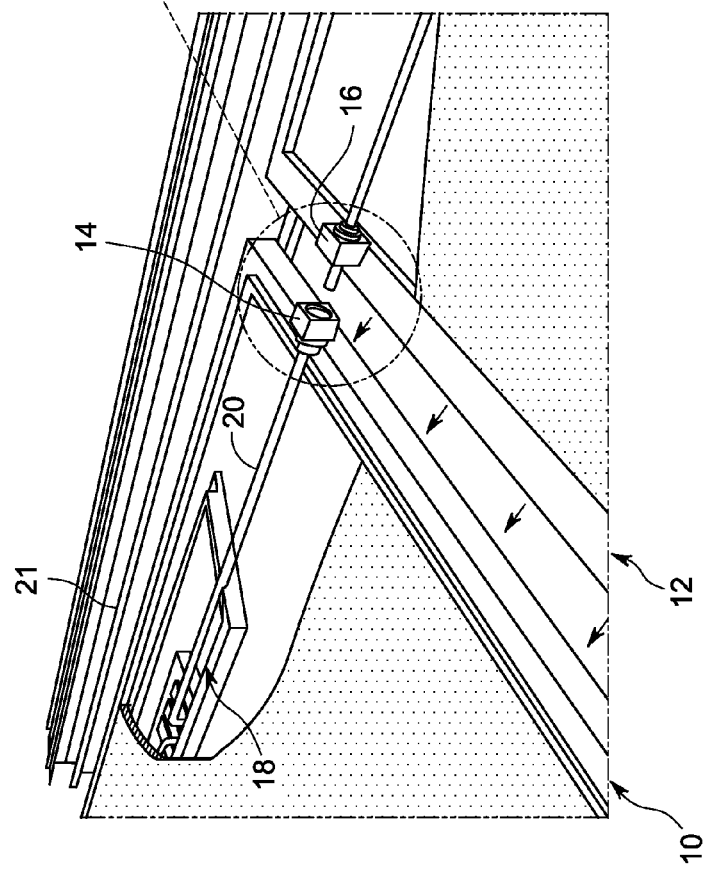
FIG. 1 illustrates a pair of solar module support frames with plug-and-play electrical connectors molded therein according to one embodiment.

FIG. 1 illustrates a pair of solar module support frames 10, 12 with plug-and-play electrical connectors 14, 16 molded therein according to one embodiment. FIG. 2 depicts the electrical connectors 14, 16 in more detail. Electrical connector 14 can be seen to be a female electrical connector, while electrical connector 16 can be seen to be a male electrical connector. According to one aspect, plug-and-play electrical connectors 14, 16 comprise quick-connect type electrical jacks that are molded into their respective solar module support frames 10, 12. Each solar module support frame 10, 12 can accommodate a solar electrical module or a solar thermal module, described in more detail herein.

Plug-and-play, as used herein, is used to describe devices that work with a system as soon as they are connected. The user does not have to manually install drivers for the device or even tell the system that a new device has been added. Instead the system automatically recognizes the device, and begins to work with the newly connected device.

Each solar module support frame 10, 12 further comprises a microinverter connector 18 molded therein to allow for electrical connections between a solar module inserted into the support frame and a respective microinverter. Microinverter connector 18 is described in further detail herein. Each solar module support frame 10, 12 further comprises electrical wiring 20 molded therein to provide an electrical pathway between a corresponding microinverter and the respective support frame electrical connectors 14, 16. According to one aspect, a non-electrified rack 21 provides the main structure for assembling and interconnecting a plurality of solar module support frames 10, 12. Although only two solar module support frames are depicted in the embodiment, any number of solar module support frames/solar modules can be assembled into the non-electrified rack 21, limited only by the physical size of the rack 21. The solar module support frames and corresponding solar modules can be connected in tandem to form a single dimensional array of solar modules; or the solar module support frames can be connected together with corresponding solar modules to form a two-dimensional array of solar modules.

Figure 3:
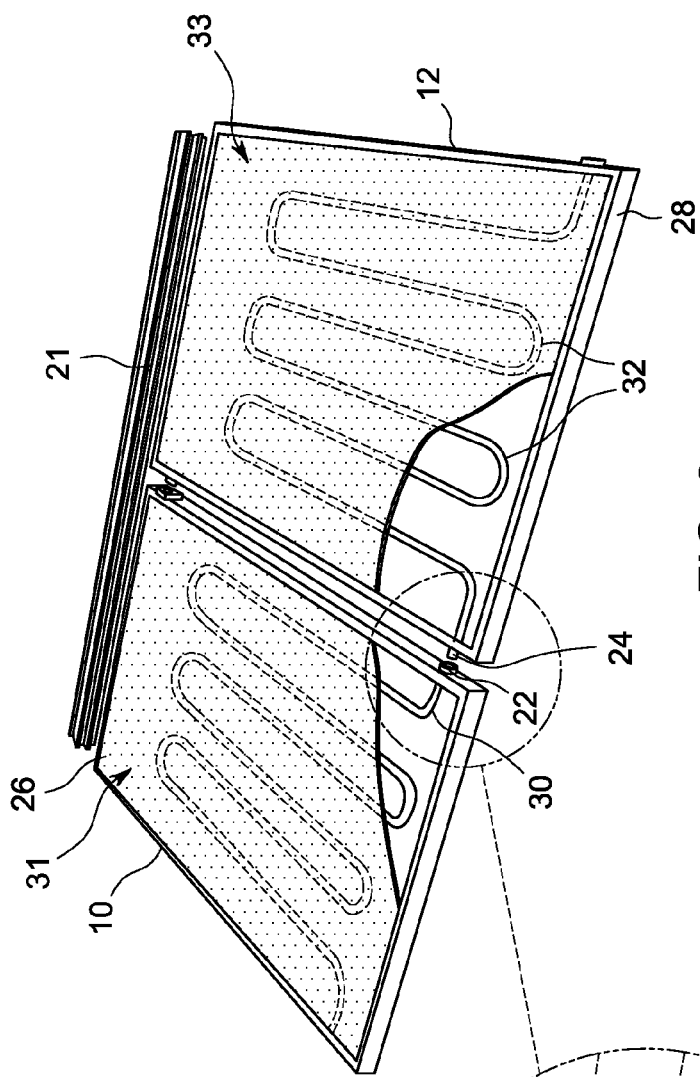
FIG. 3 illustrates the solar module support frames depicted in FIG. 1 with corresponding serpentine thermal coil assemblies and corresponding molded-in plumbing connectors according to one embodiment.
Figure 4:
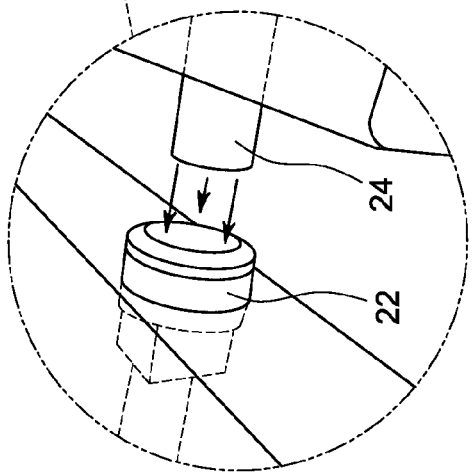
FIG. 4 illustrates the molded-in plumbing connectors depicted in FIG. 3 in more detail.

FIG. 3 illustrates a pair of solar module support frames 10, 12 with push-fit type quick connect plug-and-play mechanical plumbing connectors 24, 26 molded therein according to one embodiment. FIG. 4 illustrates the push-fit type plug-and-play mechanical plumbing connectors 22, 24 depicted in FIG. 3 in more detail. Each solar module support frame 10, 12 can accommodate an electrical solar module or a thermal solar module, as stated herein.

According to one embodiment, solar thermal modules and solar electric modules can be mounted onto a common non-electrified rack 21 via a plurality of solar module frames 10, 12. The molded-in wiring 20 depicted in FIG. 1 and electrical connectors 14, 16 may reside in the top frame rail leg 26 to support electrical connections to a respective solar electric module, while the molded in plumbing connectors 22, 24 may reside in the bottom frame rail leg 28 to support thermal fluid connections to a respective solar thermal module according to one embodiment.

According to one aspect, a set of serpentine cooling pipes 30, 32 containing a thermal fluid may be employed as a cooling brace to contact the backside of a respective solar electric module 31 to reduce its operating temperature. Heat transferred to the thermal fluid via the solar electric module 31 may advantageously be transferred to a solar thermal module 33 downstream of the solar electric module 31. According to one embodiment, a thermal heat transfer liquid passes through the solar electric module serpentine cooling pipes 30 first so that the liquid is somewhat hot when it reaches the solar thermal module(s) 33.

Figure 5:
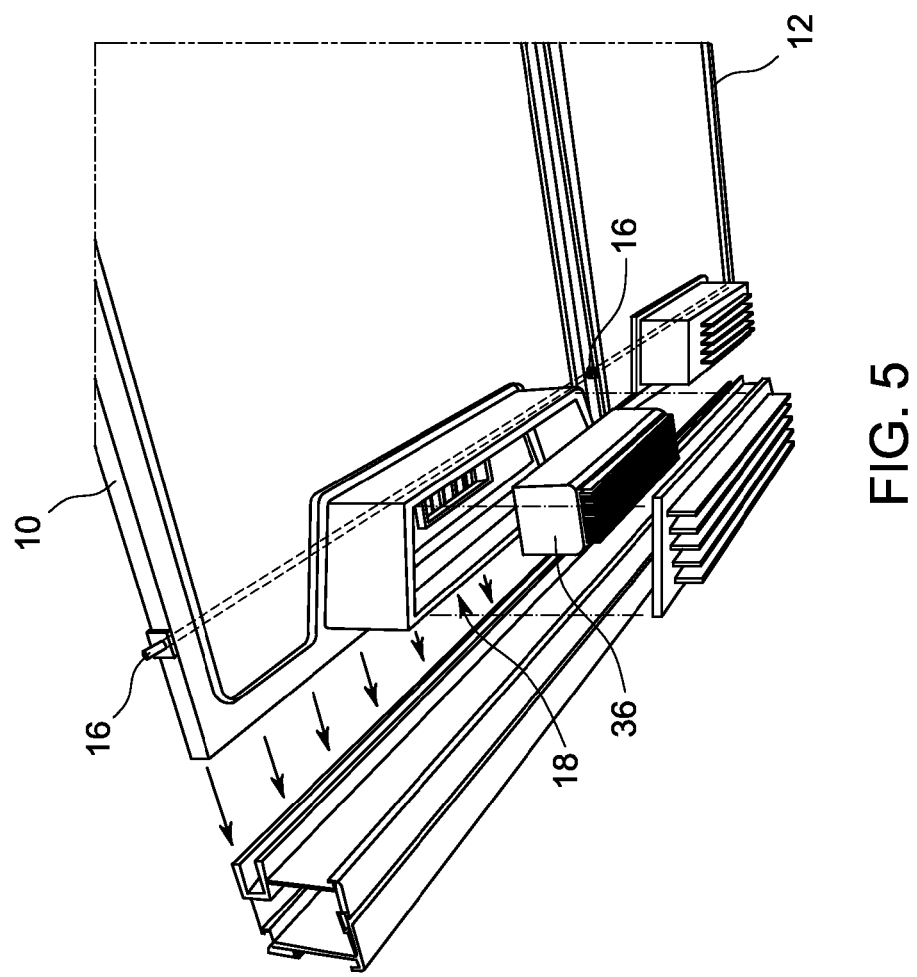
FIG. 5 illustrates a pair of solar module support frames with microinverter connectors molded therein according to one embodiment of the invention.

FIG. 5 illustrates a pair of solar module support frames 10, 12 with a microinverter connector 18 molded therein according to one embodiment of the invention. This embodiment advantageously integrates the requisite power electronics services with the supporting frame(s) 10, 12 and respective power electronics connector(s) 14, 16, 18 to simplify the installation process. According to one embodiment, each supporting frame 10, 12 is a molded frame constructed from a plastic or composite material into which can also be included a pocket to receive a respective power microinverter 36. Integrating the solar module support frame(s) 10, 12 with quick connect electrical connectors 14, 16, quick connect plumbing connectors 22, 24 and microinverter connectors 18 results in a desired plug-and-play architecture that is very cost effective to implement.

FIG. 6 illustrates an integral module power conditioning system 40 comprising a plurality of solar modules 42 installed in a string of solar module support frames interconnected via corresponding quick connect plug-and-play electrical connectors 12, 14 and corresponding quick connect plug-and-play mechanical plumbing connectors 22, 24 to accommodate electrical power and thermal transfer between the plurality of solar modules 42 according to one embodiment. Solar modules 42 may include only solar electric modules, only solar thermal modules, or both solar electric modules and solar thermal modules, as stated herein.

FIG. 7 illustrates the molded-in quick connect plug-and-play electrical connectors 12, 14 depicted in FIG. 6 in more detail; and FIG. 8 illustrates the molded-in quick connect plug-and-play mechanical plumbing connectors 22, 24 depicted in FIG. 6 in more detail.

According to one embodiment, a microinverter is integrated into one or more solar module frames 10, 12 that are constructed from metal. The frame then both operates as a heat spreader/sink and forms a case. According to one aspect, a single jumper cable can then be used to interconnect the DC input of the microinverter with the DC output of the module through a simple weather resistant connector. The plug-and-play electrical connectors integrated with the frame of the solar module according to one embodiment comprise AC connectors housing up to four wires for a 240V AC system (120V, 120V, N, G). The solar electric modules are electrically connected in parallel and routed directly to a residential load panel through a home run cable.

In summary explanation, an integral solar module power conditioning system comprises a first solar module support frame 10 comprising both a microinverter connector 18 and a plurality of plug-and-play electrical connectors 14, 16 integrated therein, wherein the first solar module support frame 10 is configured to receive a solar electric module and to carry electrical power through a plurality of solar electric modules and corresponding microinverters connected together via the first solar module support frame 10 and at least one additional solar module support frame 12 connected in tandem with the first solar module support frame 10 via the plurality of integrated plug-and-play electrical connectors 14, 16.

Embodiments consistent with the above description may provide a solar system architecture that reduces installation costs through integration of certain mechanical and electrical functions generally associated with individual components of such a system that include solar module(s), solar inverter(s) and solar module racking. As stated herein, a typical solar module system includes photovoltaic (PV) modules that are mechanically affixed to a mounting system and separately connected electrically in a wiring chain via wires that are integral to each module. The DC electric chain of series and/or parallel-connected PV modules may be routed to a DC-AC inverter. The embodiments described herein employ electrified solar module frames that include an AC or DC integral power bus and that supports integration with a solar module via a combined electrical and mechanical interconnect, eliminating the need for physical connections of wires. DC-AC or DC-DC power electronics such as power microinverter(s) 36 integrated with the individual modules advantageously provide local regulation and maximum peak power tracking (MPPT). Particular embodiments advantageously provide a solar module support frame that functions both as a structural element and inverter heat-sink enclosure through sharing of component structures. Some solar module frame embodiments described herein further support both solar thermal modules and solar electric modules mounted into a common racking system.

In further summary explanation, embodiments of an integral module power conditioning system described herein comprise one or more solar module support frames and a plurality of quick connect plug-and-play mechanical plumbing connectors integrated with each solar module support frame, wherein each solar module support frame is configured to receive a solar module and to carry a heat transfer fluid to transfer heat to or from the solar module. Embodiments of the integral module power conditioning system may comprise one or more solar modules comprising integral DC voltage regulation, maximum peak power tracking and communications, an electrified solar module frame comprising an integral AC or DC power bus, and an architecture for electrically interfacing the solar modules to the electrified frame(s) installed within a corresponding rack system that does not require the physical connection of wires.

It can be appreciated that the use of a microinverter can be employed to provide regulation at the module level to address deficiencies that result from the mismatch of module performance across a string of modules. The benefits of microinverters are however, accompanied by an increased cost, and in some cases the placement of the microinverters, e.g. attached to the backside of a module, limit the air-flow in an already difficult environment (i.e. high temperature) for inverters. The embodiments described herein provide an architecture that facilitates intelligent integration of all or a portion of the functionality of a microinverter within the construction of the module frame to reduce the sum total cost of the microinverter and module, to minimize heat build-up and operating temperature of the microinverter(s), to allow ease of access and repair of the microinverter/module and to simplify the interface to an electrified module frame. The foregoing advantages may be provided using the principles described herein without modifying the fundamental laminate structure of the solar module.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An apparatus comprising:
   a first solar module support frame comprising both a microinverter connector and a plurality of plug-and-play electrical connectors integrated therein, wherein the first solar module support frame is configured to receive both a first solar electric module and a first microinverter and to carry electrical power to the first solar module support frame plug-and-play electrical connectors, and wherein the first solar module support frame further comprises a plurality of plug-and-play thermal fluid plumbing connectors integrated therein and is further configured to receive a solar thermal module; and
   a thermal cooling brace comprising a heat transfer cooling pipe in fluid communication with the plurality of plug-and-play thermal fluid plumbing connectors for transferring a thermal fluid therethrough, wherein the thermal cooling brace is supported by the first solar module support frame, and further wherein the heat transfer cooling pipe is in direct contact with and transfers heat from a backside of the first solar electric module.

2. The apparatus according to claim 1, wherein the first solar module support frame further comprises a first rail leg and a second rail leg, wherein the first solar module support frame plug-and-play electrical connectors are integrated in the first rail leg.

3. The apparatus according to claim 2, wherein the plurality of plug-and-play thermal fluid plumbing connectors are integrated in the second rail leg.

4. The apparatus according to claim 1, wherein the first solar module support frame further comprises a pocket molded therein and configured to receive the first microinverter for coupling to the first solar electric module installed therein.

5. The apparatus according to claim 4, wherein the first solar module support frame further comprises power wiring integrated therein for coupling the first microinverter to the first solar module support frame plug-and-play electrical connectors.

6. The apparatus according to claim 1, wherein the first solar module support frame comprises a polymeric frame.

7. The apparatus according to claim 1, further comprising at least one additional solar module support frame connected in parallel with the first module support frame via a corresponding plurality of plug-and-play electrical connectors to form a two-dimensional solar module array.

8. The apparatus according to claim 1, wherein the first solar module support frame comprises a metallic framed laminate.

9. An apparatus comprising:
a plurality of solar module support frames;
a respective microinverter integrated with each solar module support frame;
a respective plurality of plug-and-play electrical connectors integrated with each solar module support frame, wherein the plurality of solar module support frames are directly connected together via the plug-and-play electrical connectors to carry electrical power through a plurality of solar electric modules and corresponding microinverters connected together via the plurality of solar module support frame plug-and-play electrical connectors; and
a respective plurality of plug-and-play thermal fluid plumbing connectors integrated with each solar module support frame, wherein the plurality of solar module support frames are further directly connected together via the plug-and-play thermal fluid plumbing connectors to carry a thermal fluid through the plurality of solar electric modules and one or more solar thermal modules connected together via the plurality of solar module support frame plug-and-play thermal fluid plumbing connectors, wherein each solar module support frame comprises a thermal cooling brace comprising a heat transfer cooling pipe for transferring the thermal fluid therethrough, wherein the thermal cooling brace is supported by a solar module support frame selected from the plurality of solar module support frames, and further wherein the heat transfer cooling pipe is in direct contact with and transfers heat from a backside of a solar electric module selected from the plurality of solar electric modules and inserted into the selected solar module support frame.

10. The apparatus according to claim 9, wherein at least one solar module support frame comprises a polymeric frame.

11. The apparatus according to claim 9, wherein at least one solar module support frame comprises a metallic framed laminate.

12. The apparatus according to claim 9, wherein the plurality of solar module support frames are connected together in tandem.

13. The apparatus according to claim 9, wherein the plurality of solar module support frames are connected together with corresponding solar electric modules selected from the plurality of solar electric modules to form a two-dimensional solar array.

14. An apparatus comprising:
a solar module rack;
a plurality of solar module support frames mounted in the solar module rack, each solar module support frame comprising both a microinverter connector and a plurality of plug-and-play electrical connectors integrated therein, wherein the plurality of solar module support frames are connected directly together via a corresponding plurality of plug-and-play electrical connectors selected from the plurality of integrated plug-and-play electrical connectors to carry electrical power through a plurality of solar electric modules and corresponding microinverters mounted in the plurality of solar module support frames;
each solar module support frame further comprising a plurality of plug-and-play thermal fluid plumbing connectors integrated therein, wherein the plurality of solar module support frames are further directly connected together via corresponding plug-and-play thermal fluid plumbing connectors selected from the plurality of plug-and-play thermal fluid plumbing connectors to carry a thermal fluid through the plurality of solar electric modules and one or more solar thermal modules connected together via the plurality of solar module support frame plug-and-play thermal fluid plumbing connectors; and
each solar module support frame further comprising a thermal cooling brace comprising a heat transfer cooling pipe for transferring the thermal fluid therethrough, wherein the thermal cooling brace is supported by a solar module support frame selected from the plurality of solar module support frames, and further wherein the heat transfer cooling pipe is in direct contact with and transfers heat from a backside of a solar electric module selected from the plurality of solar electric modules and inserted into the selected solar module support frame.

* * * * *